(12) United States Patent
McGillicudy et al.

(10) Patent No.: US 11,145,496 B2
(45) Date of Patent: Oct. 12, 2021

(54) SYSTEM FOR USING O-RINGS TO APPLY HOLDING FORCES

(71) Applicant: Varian Semiconductor Equipment Associates, Inc., Gloucester, MA (US)

(72) Inventors: Daniel McGillicudy, Peabody, MA (US); James P. Buonodono, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 654 days.

(21) Appl. No.: 15/991,328

(22) Filed: May 29, 2018

(65) Prior Publication Data
US 2019/0371580 A1      Dec. 5, 2019

(51) Int. Cl.
*H01J 37/32*          (2006.01)
*H01J 37/08*          (2006.01)
(Continued)

(52) U.S. Cl.
CPC ........ *H01J 37/32889* (2013.01); *H01J 37/08* (2013.01); *H01J 37/147* (2013.01);
(Continued)

(58) Field of Classification Search
CPC ......... Y10T 292/0863; Y10T 292/0864; Y10T 292/0869; Y10T 292/1099; Y10T 292/51; Y10T 292/62; H01J 37/32889; H01J 37/08; H01J 37/147; H01J 37/32477; H01J 37/32807; F16B 5/0208; F16B 5/0607; F16B 5/0088; F16B 2/06; E05C 5/04; B64C 3/26; B64C 3/34
See application file for complete search history.

(56) References Cited

U.S. PATENT DOCUMENTS

| 405,902 | A | * | 6/1889 | Napheys | ................ | B65D 41/02 |
| | | | | | | 215/316 |
| 4,059,202 | A | * | 11/1977 | Jones, Jr. | ................ | B63B 19/14 |
| | | | | | | 220/325 |

(Continued)

FOREIGN PATENT DOCUMENTS

| CN | 101401185 B | 12/2010 |
| CN | 106015268 A | 10/2016 |

(Continued)

OTHER PUBLICATIONS

International Search Report and Written Opinion dated Aug. 7, 2019 in corresponding PCT application No. PCT/US2019/029565.

*Primary Examiner* — Kristina R Fulton
*Assistant Examiner* — Faria F Ahmad
(74) *Attorney, Agent, or Firm* — Nields, Lemack & Frame, LLC

(57) ABSTRACT

A fastening system for attaching two components with a spring force is disclosed. The fastening system utilizes O-rings to provide the spring force, eliminating the need for any metal components. The O-ring may be disposed in an O-ring holder that has a plurality of spokes. When compressed, indentations are created in the O-ring by the spokes. The number of spokes and their size and shape determine the spring force of the fastening system. In another embodiment, vertically oriented O-rings are utilized. The fastening system may be used to fasten various components of an ion source.

19 Claims, 8 Drawing Sheets

(51) Int. Cl.
*H01J 37/147* (2006.01)
*E05C 5/04* (2006.01)

(52) U.S. Cl.
CPC .. *H01J 37/32477* (2013.01); *H01J 37/32807* (2013.01); *E05C 5/04* (2013.01); *Y10T 292/0863* (2015.04); *Y10T 292/0864* (2015.04); *Y10T 292/1099* (2015.04); *Y10T 292/51* (2015.04); *Y10T 292/62* (2015.04)

(56) References Cited

U.S. PATENT DOCUMENTS

| | | | | | |
|---|---|---|---|---|---|
| 4,655,487 | A | * | 4/1987 | Korn | E05C 1/04 292/57 |
| 4,660,873 | A | * | 4/1987 | Sholund | E05C 7/02 292/251 |
| 4,717,280 | A | * | 1/1988 | Baker | H01P 1/04 403/338 |
| 4,854,795 | A | * | 8/1989 | Duran | F16B 5/0208 411/352 |
| 5,073,070 | A | * | 12/1991 | Chang | F16B 5/0208 411/353 |
| 5,104,070 | A | * | 4/1992 | Johnson | B64G 1/646 244/172.4 |
| 5,328,655 | A | * | 7/1994 | Fortin | B29C 49/00 264/230 |
| 5,395,143 | A | * | 3/1995 | Chesterton | E05C 17/48 292/57 |
| 5,686,656 | A | * | 11/1997 | Amirav | G01N 30/12 73/23.41 |
| 5,865,397 | A | * | 2/1999 | Herrmann | B64D 45/02 244/14 |
| 6,116,660 | A | * | 9/2000 | Langkamp, Jr. | E05C 3/042 292/65 |
| 6,343,709 | B1 | | 2/2002 | Deforrest et al. | |
| 6,568,226 | B1 | * | 5/2003 | Ramsauer | E05B 17/0025 292/114 |
| 6,608,431 | B1 | * | 8/2003 | Kaufman | H01J 27/146 313/231.31 |
| 6,645,301 | B2 | * | 11/2003 | Sainty | H01J 27/02 118/665 |
| 7,425,711 | B2 | * | 9/2008 | Burtner | H01J 1/42 250/423 R |
| 7,589,474 | B2 | * | 9/2009 | Chu | H01J 27/146 313/153 |
| 8,091,723 | B2 | * | 1/2012 | Li | G03G 15/0867 220/233 |
| 8,251,410 | B1 | * | 8/2012 | Carter | F41H 7/042 292/251 |
| 8,704,444 | B2 | * | 4/2014 | Marchandise | F03H 1/0012 315/111.41 |
| 9,562,555 | B1 | | 2/2017 | Talbot et al. | |
| 10,325,752 | B1 | * | 6/2019 | Calkins | H01J 37/08 |
| 10,329,008 | B2 | * | 6/2019 | Walker | B64F 5/10 |
| 2004/0056488 | A1 | * | 3/2004 | Jackson, Jr. | E05B 17/0025 292/66 |
| 2005/0237000 | A1 | * | 10/2005 | Zhurin | H01J 27/146 315/111.81 |
| 2006/0086765 | A1 | | 4/2006 | Harberts et al. | |
| 2008/0129180 | A1 | * | 6/2008 | Murrell | H01J 37/08 313/337 |
| 2008/0136309 | A1 | * | 6/2008 | Chu | H01J 37/08 313/361.1 |
| 2008/0283498 | A1 | * | 11/2008 | Yamazaki | H01J 37/32477 216/67 |
| 2009/0032727 | A1 | * | 2/2009 | DiVergilio | H01J 37/08 250/423 R |
| 2009/0266298 | A1 | * | 10/2009 | Okashita | H01J 37/3299 118/712 |
| 2009/0288942 | A1 | * | 11/2009 | Cummings | B08B 17/02 204/192.11 |
| 2010/0038556 | A1 | * | 2/2010 | Miyamoto | H01J 27/08 250/423 R |
| 2010/0043508 | A1 | * | 2/2010 | Burmesch | B60D 1/60 70/431 |
| 2010/0055298 | A1 | * | 3/2010 | Sommers | H01J 37/32495 427/58 |
| 2010/0308606 | A1 | * | 12/2010 | de Lima Castro | G09F 3/037 292/307 R |
| 2014/0373359 | A1 | | 12/2014 | Schomaker et al. | |
| 2014/0373580 | A1 | * | 12/2014 | Le | E05B 13/002 70/224 |
| 2017/0370504 | A1 | * | 12/2017 | Li | H05H 1/46 |
| 2020/0072200 | A1 | * | 3/2020 | Wirz | H01J 27/14 |

FOREIGN PATENT DOCUMENTS

| | | |
|---|---|---|
| DE | 102005051050 A1 | 4/2007 |
| EP | 3260708 A1 | 12/2017 |
| WO | 2007/084880 A2 | 7/2007 |

* cited by examiner

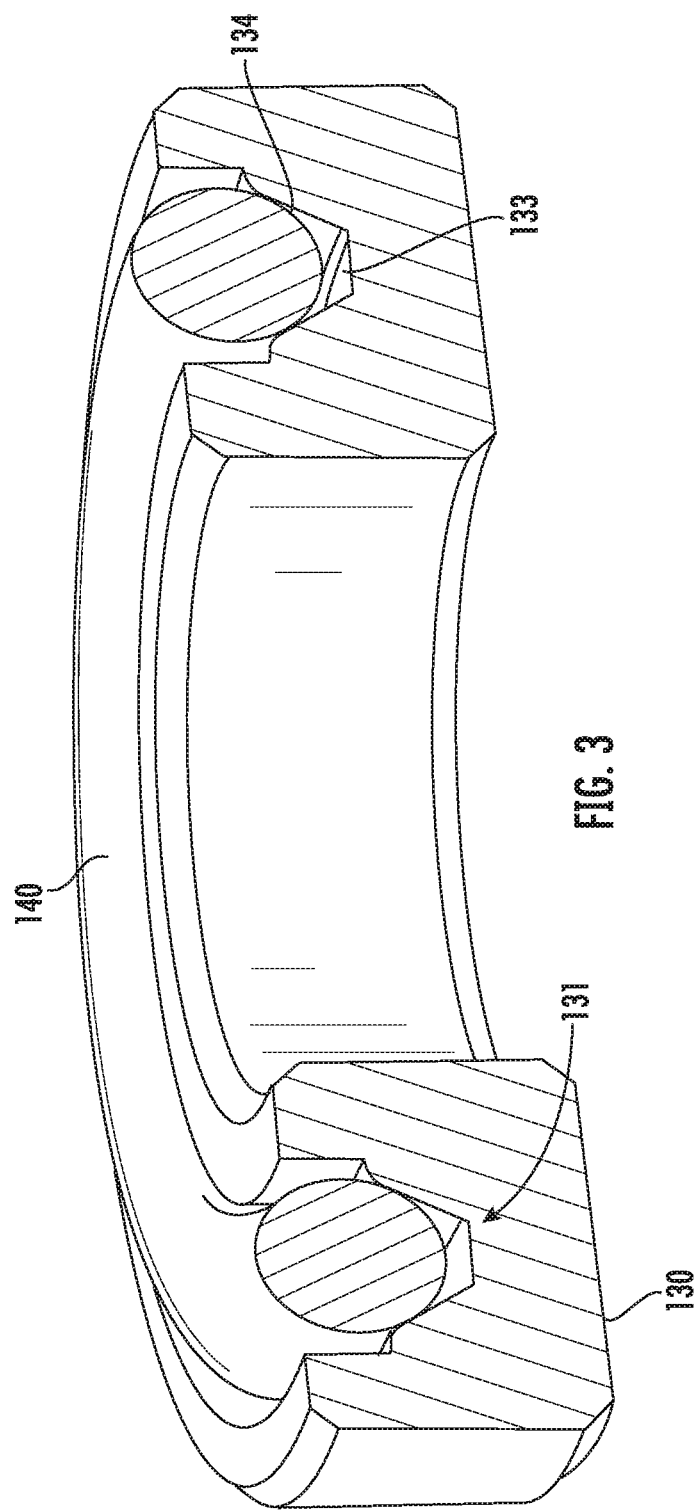

SYSTEM FOR USING O-RINGS TO APPLY HOLDING FORCES

FIELD

Embodiments of the present disclosure relate to fastening systems for holding together two components with a spring force, and more particularly, for holding two components without the use of metal springs or washers.

BACKGROUND

Ion sources are used to create a plasma that contains ions of a desired species. These ions are then typically extracted through an extraction aperture and directed toward a workpiece. Similarly, plasma chambers are also used to create a plasma, however, the workpiece is disposed within the plasma chamber.

These ion sources and plasma chambers are typically constructed of multiple components which are fastened together. However, due to the temperatures experienced by these ion sources and plasma chambers, these components are subject to thermal expansion. Consequently, the fasteners allow for some amount of relative movement. This is typically achieved by using springs with the desired spring force.

However, new etching and process methods use very reactive process gases that aggressively attack metallic components. When these metal components are attacked by the process gas, the liberated materials coat the surfaces of the ion source or plasma chamber. The liberated materials may also migrate to the surface of the workpiece as contaminants and particles.

Therefore, it would be beneficial if there were a fastening system for holding two components with a spring force that did not cause contamination of the workpiece. This system could be used in any application where the use of a metal spring may lead to contamination.

SUMMARY

A fastening system for attaching two components with a spring force is disclosed. The fastening system utilizes O-rings to provide the spring force, eliminating the need for any metal components. The O-ring may be disposed in an O-ring holder that has a plurality of spokes. When compressed, indentations are created in the O-ring by the spokes. The number of spokes and their size and shape determine the spring force of the fastening system. In another embodiment, vertically oriented O-rings are utilized. The fastening system may be used to fasten various components of an ion source.

According to one embodiment, a fastening system for fastening a first component to a second component is disclosed. The fastening system comprises a pin, having a head and a body; a latch having a center opening dimensioned so that the body of the pin passes therethrough; an O-ring holder having a circular recess with a bottom, an inner sidewall and an outer sidewall; and a O-ring, where the O-ring is disposed in the circular recess and is disposed between an underside of the latch and the O-ring holder. In certain embodiments, the pin comprises a groove disposed along the body, where the center opening is dimensioned so that the latch is locked in the groove when rotated by a quarter turn. In certain embodiments, the O-ring is compressed when the latch is locked in the groove. In certain embodiments, the O-ring holder comprises a plurality of spokes, extending upward from the bottom of the circular recess, the plurality of spokes contacting a bottom surface of the O-ring. In some embodiments, each of the plurality of spokes attach to the inner sidewall and the outer sidewall. In some embodiments, each of the plurality of spokes comprises a free end, distal from the bottom, and wherein the free end of each of the plurality of spokes is tapered. In other embodiments, the free end is flat. In certain embodiments, each of the plurality of spokes is spaced apart from an adjacent spoke by an angle of 360°/N, where N is a number of spokes. In some embodiments, N may be between 3 and 8.

According to another embodiment, a fastening system for fastening a first component to a second component is disclosed. The fastening system comprises a pin, having a head and a body; a latch having a center opening dimensioned so that the body of the pin passes therethrough; an O-ring holder having a plurality of vertical slots; and a plurality of O-rings, where each of the plurality of O-rings is disposed in a respective vertical slot, and contacts an underside of the latch. In certain embodiments, each of the plurality of vertical slots is spaced apart from an adjacent vertical slot by an angle of 360°/N, where N is a number of vertical slots. In certain embodiments, N is between 3 and 8.

According to another embodiment, an extraction plate assembly for use with an ion source is disclosed. The extraction plate assembly comprises an extraction plate having an extraction aperture; and a hole proximate the extraction aperture; a blocker, having an opening; and a fastening system, comprising: a pin, having a head and a body, passing through the hole and the opening; a latch having a center opening dimensioned so that the body of the pin passes therethrough; an O-ring holder; and an O-ring, where the O-ring is disposed in the O-ring holder and is pressed against an underside of the latch. In certain embodiments, the O-ring holder is disposed against the blocker. In certain embodiments, the O-ring holder comprises a circular recess with a bottom, an inner sidewall and an outer sidewall; and the O-ring is disposed in the circular recess. In certain further embodiments, the O-ring holder comprises a plurality of spokes, extending upward from the bottom of the circular recess, the plurality of spokes contacting a bottom surface of the O-ring. In certain embodiments, the O-ring holder comprises a plurality of vertical slots; and a plurality of O-rings, where each of the plurality of O-rings is disposed in a respective vertical slot.

BRIEF DESCRIPTION OF THE FIGURES

For a better understanding of the present disclosure, reference is made to the accompanying drawings, which are incorporated herein by reference and in which:

FIG. 3 shows the O-ring and O-ring holder of FIG. 1 according to one embodiment;

DETAILED DESCRIPTION

As described above, in certain embodiments, ion sources or plasma chambers are held together using fastening systems that include some amount of spring force to accommodate thermal expansion.

The present disclosure describes several fastening systems that achieve this goal without the use of any metallic components. This is especially beneficial in any environment where the metallic components may be subjected to caustic gasses, or other conditions that cause their degradation or compromise their operation.

Figure 10:
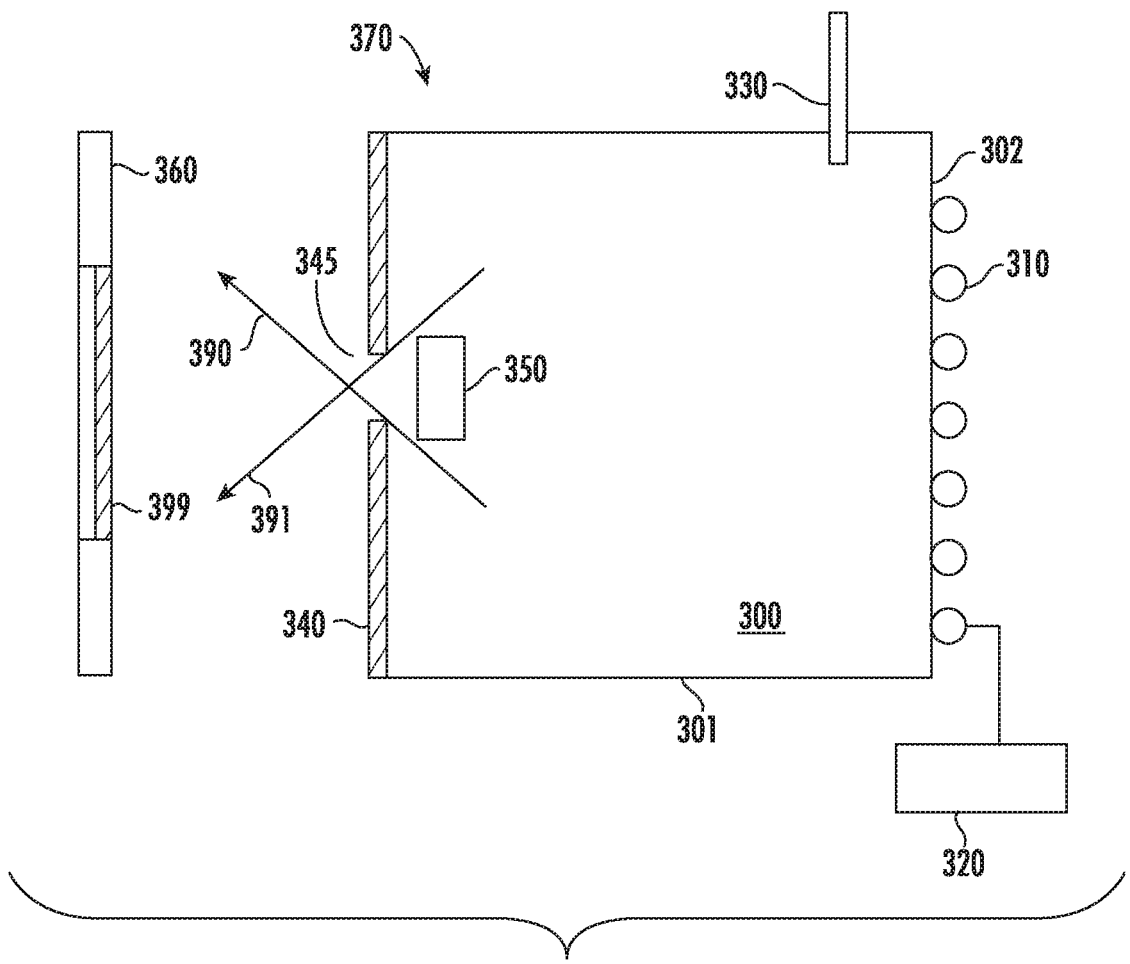
FIG. 10 shows an ion source that uses the fastening system described herein.

FIG. 10 shows one such embodiment. The system 370 includes an ion source chamber 300, comprised of a plurality of chamber walls 301. In certain embodiments, one or more of these chamber walls 301 may be constructed of a dielectric material, such as quartz. An RF antenna 310 may be disposed on an exterior surface of a first dielectric wall 302. The RF antenna 310 may be powered by a RF power supply 320. The energy delivered to the RF antenna 310 is radiated within the ion source chamber 300 to ionize a feed gas, which is introduced via gas inlet 330. In other embodiments, the gas is ionized in a different manner, such as through the use of an indirectly heated cathode (IHC), a capacitively coupled plasma source, an inductively coupled plasma source, a Bernas source or any other plasma generator.

One chamber wall, referred to as the extraction plate 340 includes an extraction aperture 345 through which ions may exit the ion source chamber 300. The extraction plate 340 may be constructed of an electrically conductive material, such as titanium, tantalum or another metal. The extraction plate 340 may be in excess of 300 millimeters in width. Further, the extraction aperture 345 may be wider than the diameter of the workpiece 399.

A platen 360 is disposed outside the ion source chamber 300 proximate the extraction aperture 345. The workpiece 399 is disposed on the platen 360.

Disposed within the ion source chamber 300 may be a blocker 350. The blocker 350 may be a dielectric material that is used to affect the plasma sheath in the vicinity of the extraction aperture 345. In other embodiments, the blocker 350 may be a metal coated with a dielectric material, such as a ceramic material. For example, in certain embodiments, the blocker 350 is disposed such that the ions exit the extraction aperture 345 at an extraction angle that is not perpendicular to the workpiece 399. In certain embodiments, ions may be extracted at two different extraction angles, such as is shown in FIG. 10. In this embodiment, a first beamlet 390 and a second beamlet 391 are directed toward the workpiece 399. In other embodiments, the ions are extracted at a single extraction angle. The placement of the blocker 350 within the ion source chamber 300 relative to the extraction aperture 345 defines the angle at which the ions exit the ion source chamber 300 and impact the workpiece 399. The blocker 350 may be attached to the extraction plate 340 using any of the fastening systems described herein.

Figure 1:
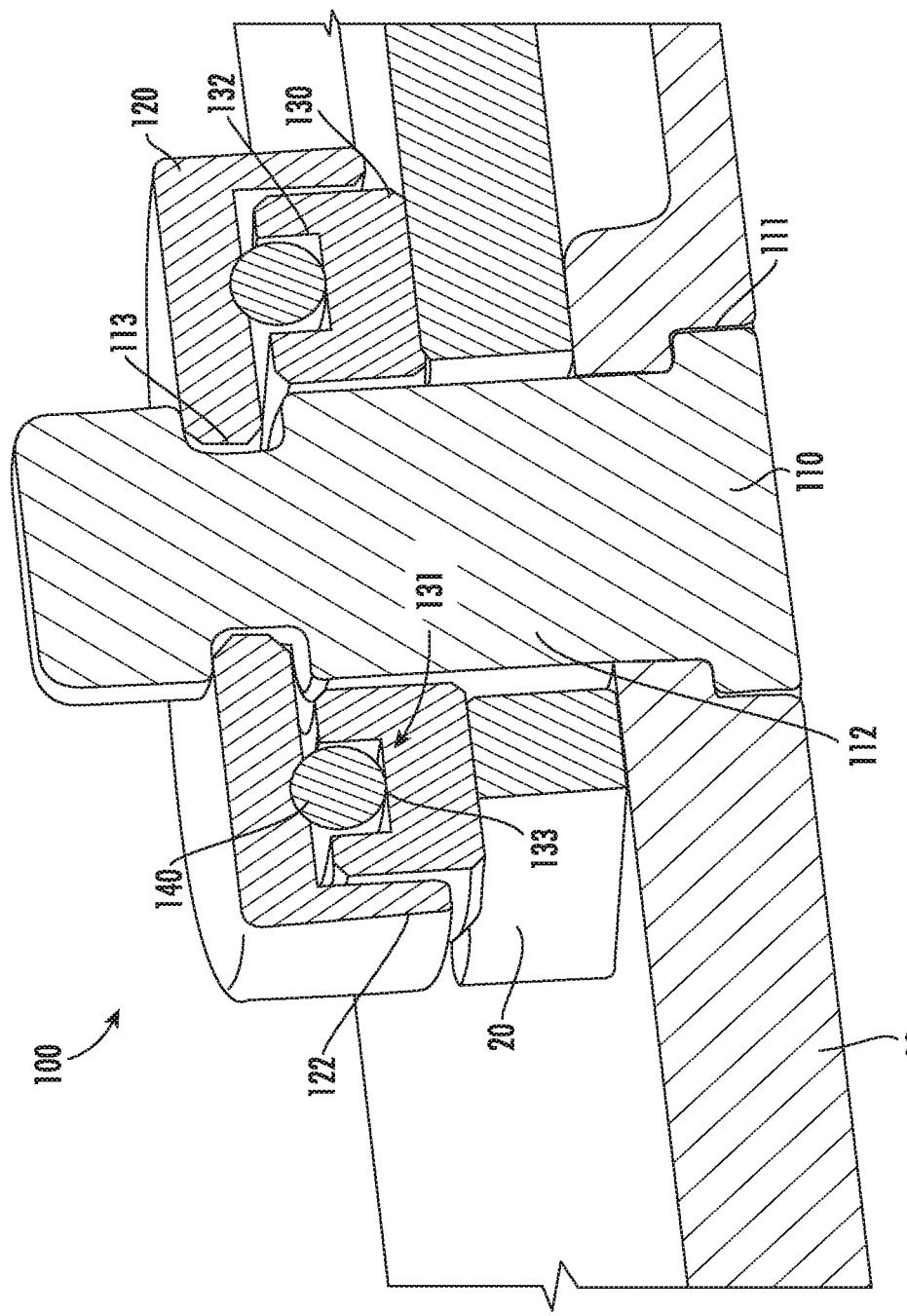
FIG. 1 is a view of the fastening system according to one embodiment.

FIG. 1 shows a fastening system 100 according to one embodiment. This fastening system 100 is used to hold a first component 10 and a second component 20 together. For example, the first component 10 may be the extraction plate 340 of FIG. 10, while the second component 20 may be a blocker 350.

The fastening system 100 comprises a pin 110 that passes through holes or openings in the first component 10 and the second component 20. The pin 110 may be made from alumina, quartz or a high performance material (HPM) that is resistant to etching. Of course, other suitable materials may also be used. The pin 110 may have a head 111, larger than the body 112 so that the head 111 cannot pass through the holes or openings in the first component 10. In certain embodiments, the first component 10 may be countersunk so that the head 111 rests in a recess in the first component 10. In certain embodiments, the head 111 of the pin 110 may be circular, having a diameter of between 0.5 and 1.0 inches. At least a portion of the body 112 of the pin 110 may be oval in shape and have a length along its major axis of between 0.4 to 0.6 inches, and a length along its minor axis of between 0.2 and 0.4 inches. Of course, these dimensions are merely illustrative. Other dimensions may also be used.

Figure 2A:
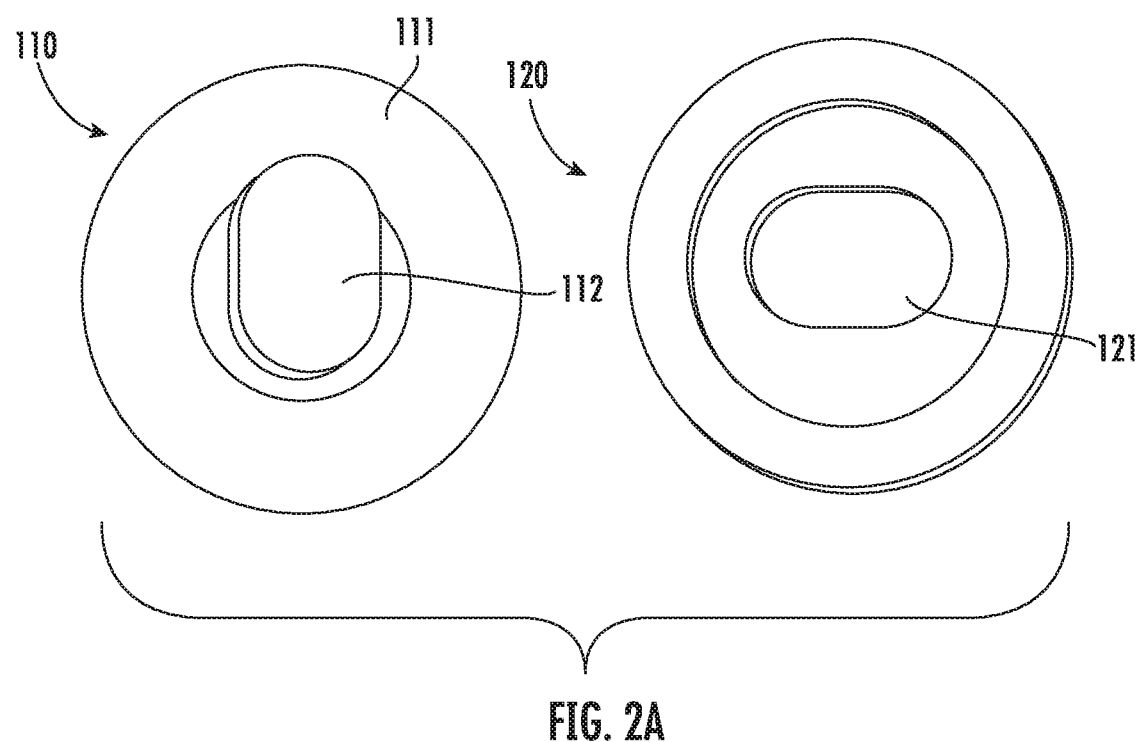
FIG. 2A shows a top view of the pin and latch of the fastening system of FIG. 1.
Figure 2B:
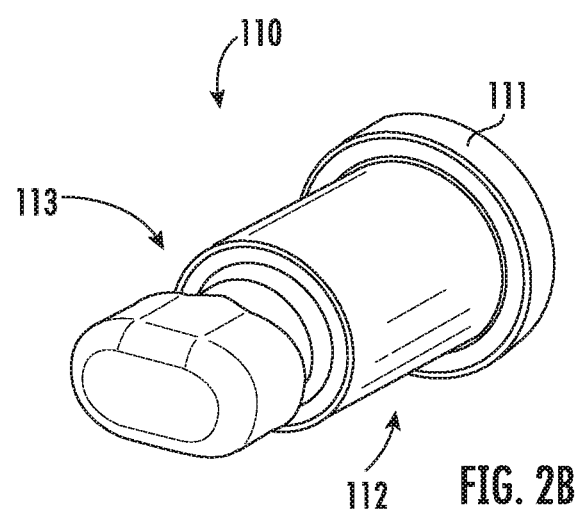
FIG. 2B shows a pin according to another embodiment.

As noted above, in some embodiments, at least a portion of the body 112 of the pin 110 may have an oval or elliptical cross-section, as best seen in FIG. 2A. Further, as seen in FIG. 1, a groove 113 may be disposed on the body 112 to allow attachment of the latch 120. In certain embodiments, the entire body 112 of the pin 110 may have an elliptical cross-section. In other embodiments, the body 112 of the pin 110 may have a circular cross-section from the head 111 to the groove 113, and may have an elliptical cross-section after the groove 113, as shown in FIG. 2B. As shown in FIG. 2A, the latch 120 may be circular with an opening 121 that is oval or elliptical. The latch 120 may be made of HPM, alumina, quartz or any other suitable material. The opening 121 may be sized to be slightly larger than the cross-section of the body 112. In this way, the latch 120 may be placed over the pin 110 such that the opening 121 and the body 112 are similar aligned. The latch 120 may then be lowered onto the pin 110. When the latch 120 reaches the level of the groove 113, the latch 120 may be rotated a quarter turn (i.e. 90°) such that the latch 120 is now retained by the groove 113.

In another embodiment, the latch 120 may have a C-clip shape, and only use a section of an O-ring instead of a continuous circular O-ring. The C-clip would have a tapered surface, such as a ramp, allowing the C-clip to be slid in easily at first, then applying the spring force as the C-clip is fully inserted.

Although not shown, in other embodiments, the body 112 of the pin 110 may have a round cross-section. In this embodiment, the pin 110 may have a head that has an oval or elliptical cross-section. Once the latch 120 passes the head of the pin 110, it may be rotated a quarter turn to secure it in place.

In certain embodiments, the latch 120 has a flange 122 that extends downward from its outer edge. The flange 122 may cover the O-ring 140 and part of the O-ring holder 130, as described below.

An O-ring holder 130 may be disposed on the second component 20, and rests beneath the latch 120. The O-ring holder 130 may be made of HPM, alumina, quartz or any other suitable material. As seen in FIG. 1 and FIG. 3, the O-ring holder 130 may be an annular ring having an inner diameter and an outer diameter. The inner diameter may be at least as large as the major axis of the body 112 of the pin 110 to allow the pin 110 to pass through the hole in the center of the O-ring holder 130. The inner diameter may be 0.4 to 0.6 inches in certain embodiments. In other embodiments, the O-ring holder 130 may not be an annular ring. Rather the O-ring holder 130 may have a circular outer edge, but the inner edge may have the same shape as the body 112 of the pin 110. In all embodiments, the body 112 of the pin 110 is able to pass through the hole in the center of the O-ring holder 130. The O-ring holder 130 may also have a circular recess 131 in which the O-ring 140 is disposed.

An O-ring 140 is disposed in the O-ring holder 130. The O-ring 140 is oriented such that the pin 110 passes through the central hole in the O-ring 140. In other words, the O-ring 140 is horizontally oriented relative to the pin 110. In some embodiment, the inner diameter of the O-ring 140 may be between 0.6 and 0.8 inches, while the outer diameter is between 0.8 and 1.2 inches. The width of the O-ring 140 may be between 0.1 and 0.2 inches. Of course, other dimensions may be used. In certain embodiments, the O-ring 140 may be constructed of a perfluoroelastomer. The O-ring 140 is in physical contact with the O-ring holder 130 on its bottom surface and the latch 120 on its upper surface. In certain embodiments, the O-ring 140 is compressed between the O-ring holder 130 and the latch 120. The O-ring 140 may be constructed of any suitable material, such as synthetic rubber, fluoroelastomers or other types of elastomers. The O-ring 140 has a certain resistance to indentation, typically measured by a durometer. Higher values indicate less flexibility.

As seen in FIG. 1, the diameter of the latch 120 may be larger than that of the O-ring 140 and the O-ring holder 130, so that the flange 122 may cover the O-ring 140 and at least a portion of the O-ring holder 130. In certain embodiments, the flange 122 may extend all the way to the top surface of the second component 20. In other embodiments, a gap may exist between the flange 122 and the top surface of the second component 20.

The circular recess 131 may have a variety of different cross-sections. For example, FIG. 1 shows the cross-section of the circular recess 131 as having two vertical sidewalls 132 and a bottom 133, which may be horizontal. In contrast, FIG. 3 shows a cross-section having two inwardly sloped sidewalls 134 and a bottom 133, which may be horizontal. The configuration of the sidewalls and the bottom may affect the spring force of the O-ring 140. In other words, in FIG. 1, any compression of the O-ring 140 forces an upward force, since the entirety of the bottom surface of the O-ring is disposed directly on the bottom 133. In contrast, in the configuration shown in FIG. 3, the inwardly sloped sidewalls 134 are supporting the O-ring 140. Thus, compression of the O-ring 140 may deform the O-ring 140 and push it deeper into the recess 131 toward the bottom 133. This may result in a lower spring force for the O-ring 140 in this configuration. Stated differently, the amount that the O-ring 140 can deform toward the bottom 133 may be deterministic of the spring force of the O-ring 140.

Figure 4A:
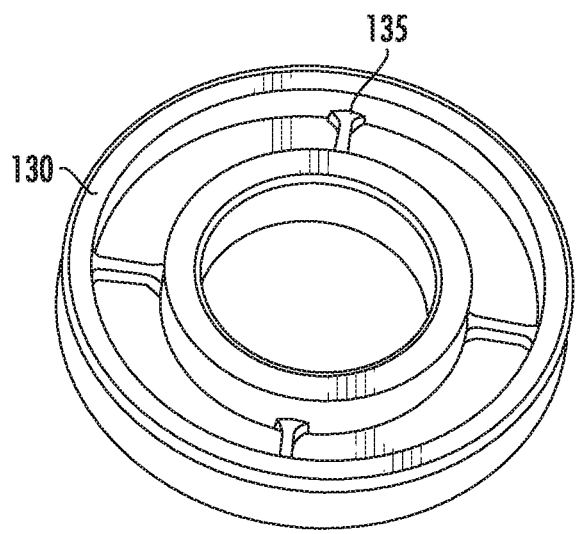
FIG. 4A-4F show various embodiments of the O-ring holder for use in the embodiment of FIG. 1.
Figure 4B:
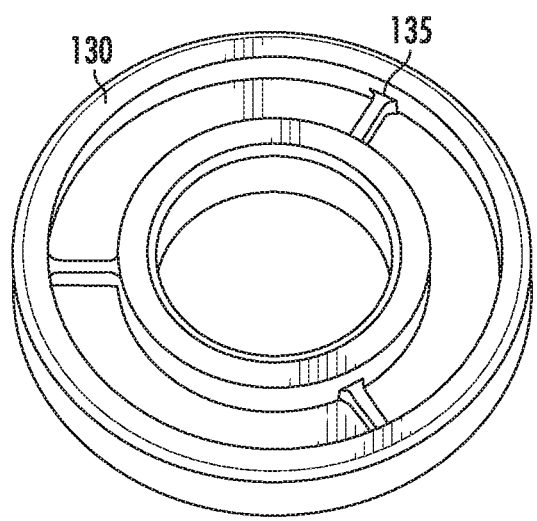
Figure 4C:
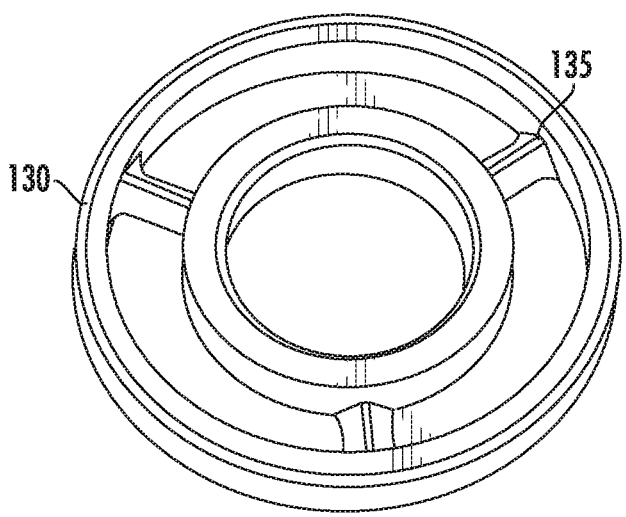
Figure 4D:
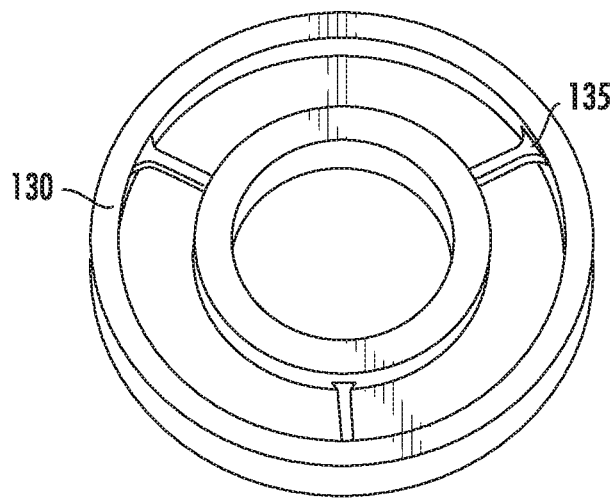
Figure 4E:
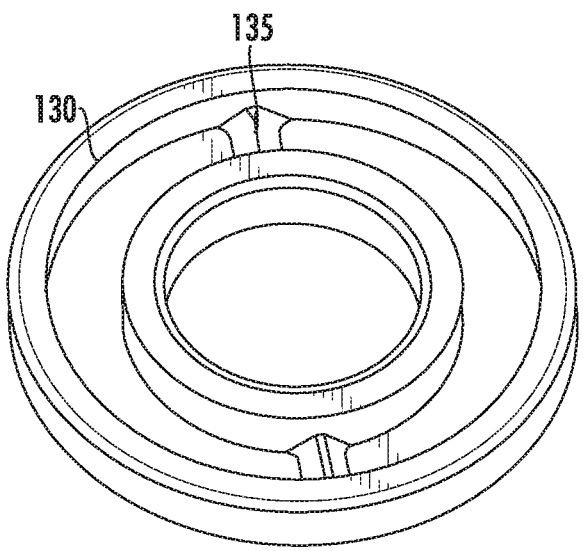
Figure 4F:
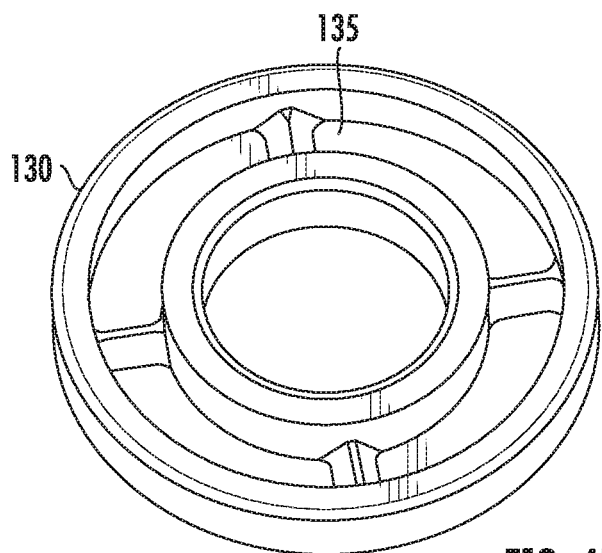

With this in mind, a plurality of different O-ring holders may be designed. FIGS. 4A-4F show six different embodiments where each O-ring holder 130 comprises a bottom 133, which may be horizontal, an inner sidewall and an outer sidewall, which may comprise vertical sidewalls 132. Of course, inwardly sloped sidewalls 134 may alternatively be used. Each O-ring holder 130 also comprises at least one spoke 135 that extends upward from the horizontal bottom 133. A spoke 135 is an upward protrusion from the bottom 133 of the O-ring holder 130. Each spoke 135 may extend from the inner sidewall to the outer sidewall and be attached or molded to these two sidewalls. The spokes 135 may not extend to the top of the vertical sidewalls 132. The distance from the horizontal bottom 133 to the top of the free end of the spoke 135 may be referred to as the height of the spoke 135. The width of the spoke refers to the dimension of the spoke 135 in the direction perpendicular to the radial direction. A spoke 135 may have a tapered free end as shown in FIG. 4E-4F, or may have a flat free end as shown in FIGS. 4B and 4D. A tapered free end indicates that the spoke 135 is wider near the bottom 133 than at its free end. This includes embodiments in which the free end may terminate in a sharp edge, or a dull edge. A flat free end indicates that the spoke 135 is the same thickness near the bottom 133 as it is at the free end. Further, the width of the spokes 135 may vary. For example, the spokes of FIG. 4B are thinner than the spokes of FIG. 4C. Additionally, the number of spokes may vary. For example, FIG. 4E shows two spokes, FIGS. 4B-D show three spokes, while FIGS. 4A and 4F show four spokes. Of course, an arbitrary number of spokes may be used. To allow the O-ring 140 to sit flat on the O-ring holder 130, the spokes 135 may be equally spaced apart. Therefore, the angle between adjacent spokes may be defined as 360°/N, where N is the number of spokes. In certain embodiments, the number of spokes may be between 3 and 8.

Figure 5:
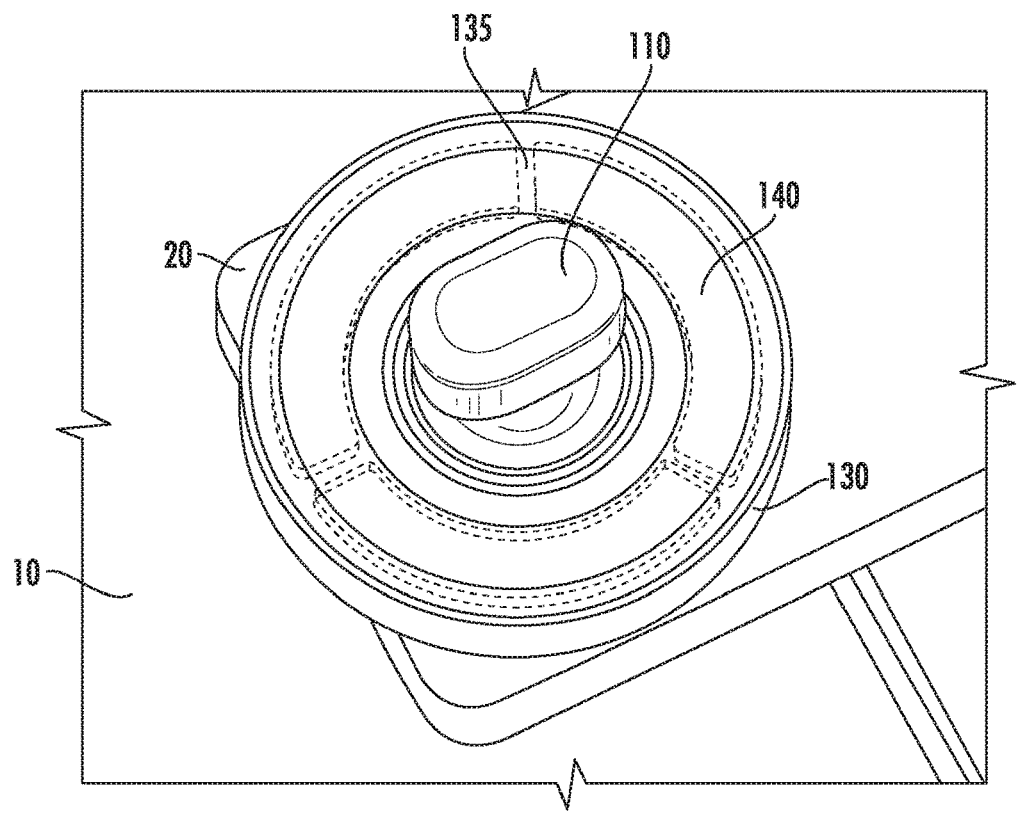
FIG. 5 shows the pin, O-ring holder and O-ring assembled according to one embodiment.

In operation, the pin 110 is placed through openings or holes in the first component 10 and the second component 20. The O-ring holder 130 is slipped over the pin 110. The O-ring 140 is then disposed on the O-ring holder 130, and specifically, rested on the spokes 135 of the O-ring holder 130. This can be seen in FIG. 5. The latch 120 is then placed over the pin 110 and secured to the groove 113 by a quarter turn. The O-ring 140 is in physical contact with both the latch 120 and the spokes 135 and may be slightly compressed in the default state. In certain embodiments, the default amount of spring force may be between 3 and 9 pounds, although other values may be used. If the fastening system 100 is subjected to heat, thermal expansion may cause the first component 10 and/or the second component 20 to expand. Since the distance between the latch 120 and the head 111 of the pin is fixed, this expansion is accommodated by compression of the O-ring 140. Specifically, the O-ring 140 is pressed into the spokes 135, such that the O-ring 140 is indented by each spoke 135. The number, height and shape of the spokes 135 determine the amount of force that is expended to create the indentations. An O-ring holder 130 having fewer spokes 135 with tapered free ends will result in a lower spring force than an O-ring holder having more spokes or one with non-tapered spokes 135.

The determination of the number of spokes 135, the width and height of each spoke 135 and whether the spokes have tapered free ends are design choices based on the desired spring force that the O-ring 140 is intended to provide. The number of spokes, the width of the spokes and the depth of the spokes may greatly affect the spring forces.

While FIGS. 4A-4F show the spokes 135 disposed on the O-ring holder 130, other embodiments are also possible. For example, in an alternate embodiment, spokes may also be disposed on the underside of the latch 120. The spokes on the latch 120 and the spokes 135 on the O-ring holder 130 may be aligned, such that the O-ring 140 is contacted at the same points on its upper surface and its lower surface. For example, assume that each has three spokes. Then, when assembled, the spokes 135 of the O-ring holder 130 may be disposed at arbitrary angles of 0°, 120° and 240°. The spokes of the latch 120 may then also be disposed at angles 0°, 120° and 240°.

In another embodiment, the spokes 135 of the O-ring holder 130 are not aligned with the spokes of the latch 120 when the fastening system 100 is assembled. In one particular embodiment, the spokes of the latch 120 may be configured to be disposed between the spokes 135 of the O-ring holder 130. When assembled, the spokes 135 of the O-ring holder 130 may be disposed at arbitrary angles of 0°, 120° and 240°. The spokes of the latch 120 may then be disposed at angles 60°, 180° and 300°.

In yet another embodiment, the O-ring holder 130 may have the circular recess 131, but may lack spokes 135. Rather, the spokes may be disposed only on the underside of the latch 120. In certain embodiments, an O-ring holder 130 may not be employed if the underside of the latch 120 includes spokes and a circular recess.

While the O-ring 140 may be oriented horizontally, other embodiments are also possible. FIGS. 6-9 show another embodiment of the fastening system 200 where the O-rings are oriented vertically. Rather than relying on the ability to compress or indent the material used to construct the O-ring, this embodiment relies on the ability to distort the circular shape of the O-ring to achieve the spring force.

Like the earlier embodiments, this fastening system 200 utilizes a pin 110 and a latch 120 to secure a first component 10 to a second component 20.

Figure 6:
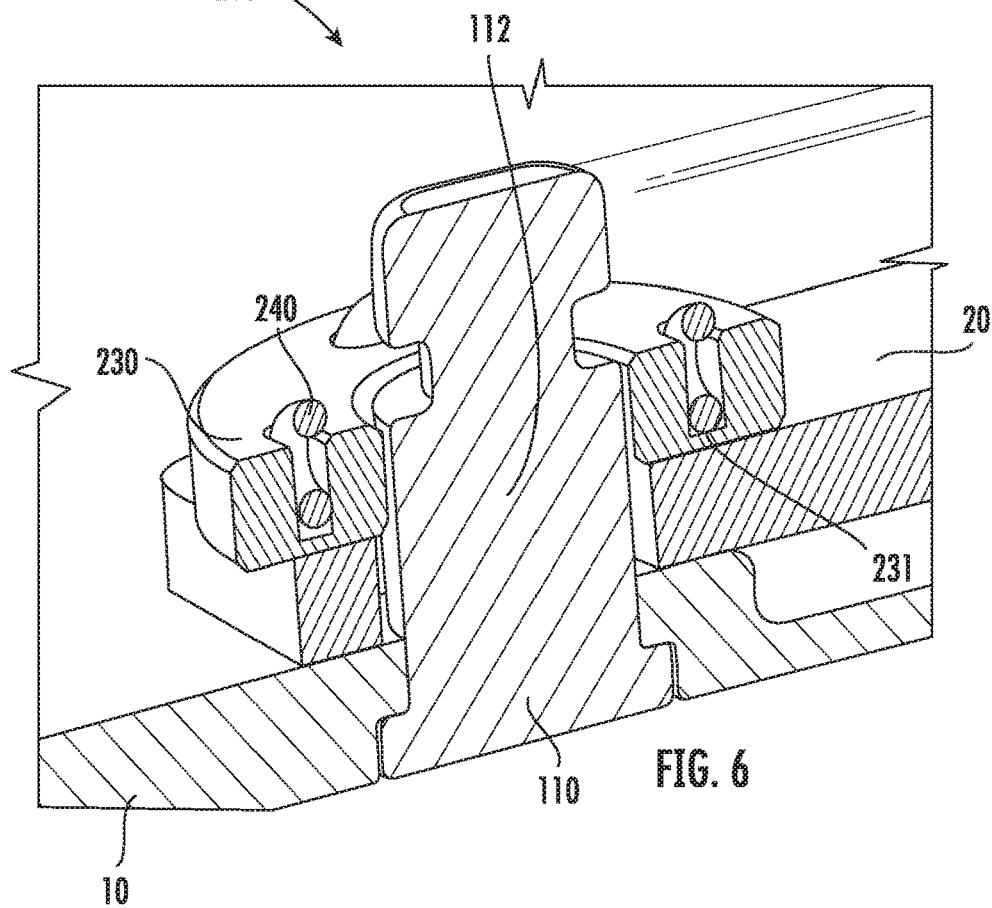
FIG. 6 is a view of a fastening system according to a second embodiment.
Figure 8:
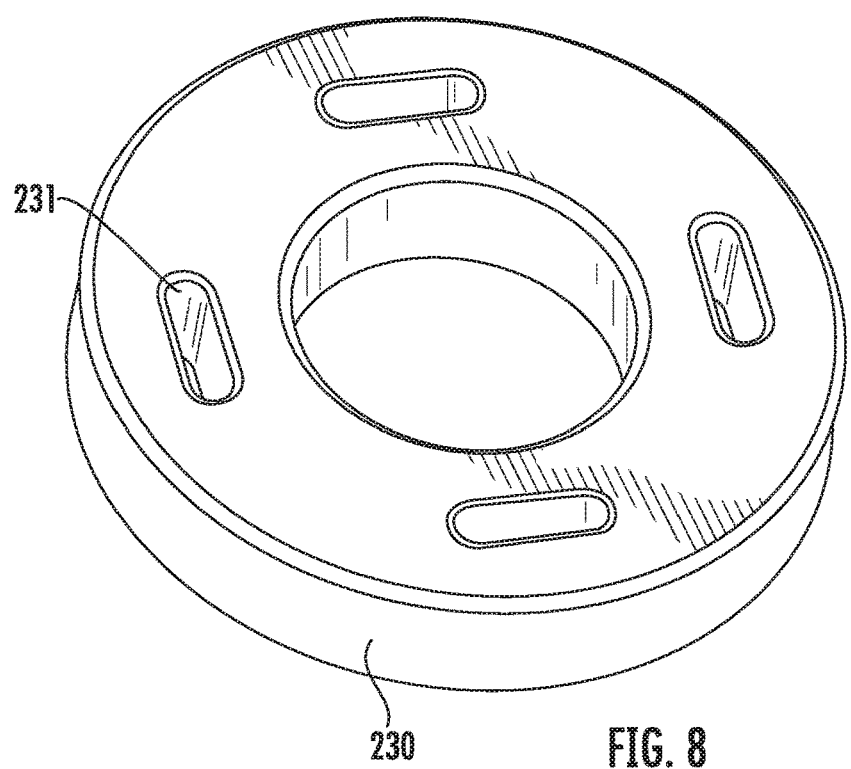
FIG. 8 shows the O-ring holder used with the fastening system of FIGS. 6 and 7.
Figure 9:
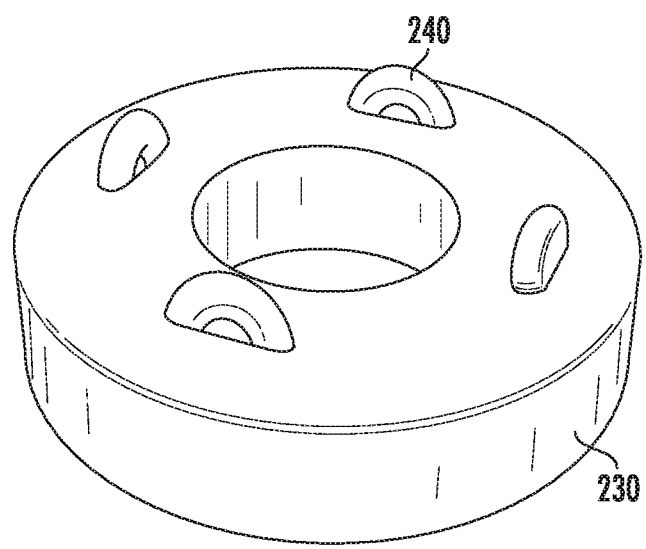
FIG. 9 shows the O-ring holder of FIG. 8 with the O-rings installed.

As best seen in FIG. 8 and FIG. 9, the O-ring holder 230 may be an annular ring having an inner diameter and an outer diameter. The inner diameter may be at least as large as the major axis of the body 112 of the pin 110 to allow the body 112 of the pin 110 to pass through the center hole in the O-ring holder 230. In other embodiments, the O-ring holder 230 may not be an annular ring. Rather the O-ring holder 230 may have a circular outer edge, but the inner edge may have the same shape as the body 112 of the pin 110. In all embodiments, the body 112 of the pin 110 is able to pass through the center hole in the O-ring holder 230. The O-ring holder 230 may be made of HPM, alumina, quartz or any other suitable material. Unlike the previous embodiments, the O-ring holder 230 comprises a plurality of vertical slots 231, as best seen in FIG. 6 and FIG. 8. The number of vertical slots 231 may vary and may be any number greater than 1. The vertical slots 231 may be equally spaced about the O-ring holder 230. For example, FIGS. 8 and 9 show four vertical slots 231 where the midpoint of each vertical slot 231 is spaced apart from the midpoint of the adjacent vertical slots by 90°. In general, the midpoint of each vertical slot 231 is spaced apart from the midpoint of the two adjacent vertical slots 231 by 360°/N, where N is the number of vertical slots 231. In certain embodiments, N is between 3 and 8.

FIG. 6 and FIG. 9 show a plurality of O-rings 240 each disposed in a respective vertical slot 231. The O-rings 240 have an outer diameter, an inner diameter and a width. In certain embodiments, the outer diameter may be between 0.2 and 0.3 inches, the inner diameter may be between 0.05 and 0.150 inches and the width may be between 0.05 and 0.1 inches. Of course, other dimensions may also be used. The vertical slots 231 each have a depth, a length and a width. In certain embodiments, the depth may be between 0.1 and 0.3 inches, the length may be between 0.1 and 0.3 inches and the width may be between 0.05 and 0.1 inches. Of course, other dimensions may also be used. It is noted that the vertical slots 231 may not extend completely through the O-ring holder 230. The width of the vertical slots 231 may be equal to or slightly greater than the width of the O-rings 240. The length of the vertical slots 231 is equal to or slightly greater than the outer diameter of the O-rings 240. Finally, the depth of the vertical slots 231 is slightly less than the outer diameter of the O-rings 240 so that, when disposed in the vertical slots 231, the O-rings 240 protrude from the top of the vertical slots 231, as shown in FIG. 9. In certain embodiments, the narrower the vertical slot 231, the more it would restrict the O-ring 240 from compressing, causing higher spring forces. Conversely, the wider the vertical slot 231 relative to the O-ring 240, the less spring force.

Figure 7:
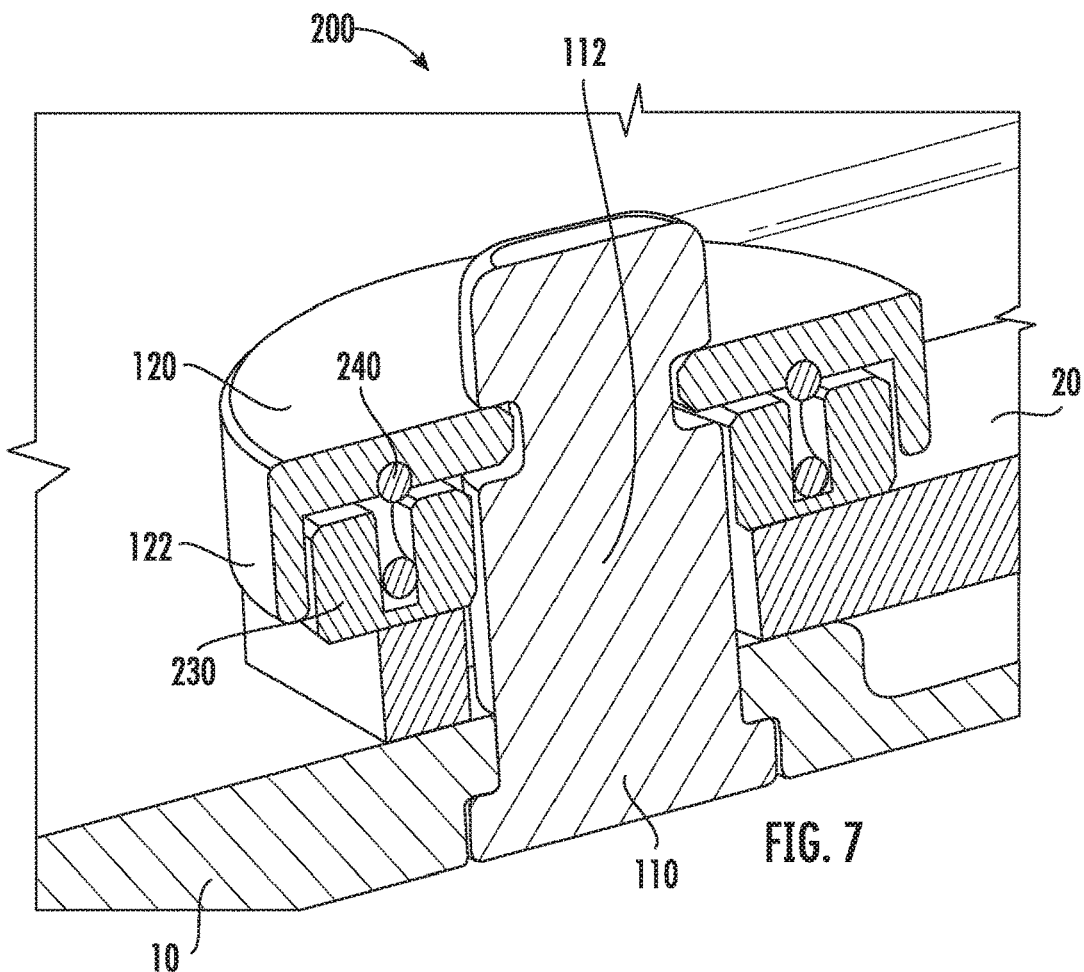
FIG. 7 shows the fastening system of FIG. 6 with the latch.

As seen in FIG. 7, when the latch 120 is attached to the pin 110, the underside of the latch 120 contacts the O-rings 240, creating a spring force. The amount of spring force is related to the width of the O-rings 240, the distance that the O-rings 240 extend above the O-ring holder 230, the area of the O-ring surface being compressed and the material used to construct the O-rings 240. As described above, changes in dimension caused by thermal expansion may be accommodated by the spring force in the O-rings 240. Additionally, the flange 122 of the latch 120 may extend downward so as to cover the O-rings 240 and part or all of the O-ring holder 230.

Thus, referring to FIG. 10, an extraction plate assembly may be constructed using the fastening systems described herein. The extraction plate assembly includes an extraction plate 340, a blocker 350, and a fastening system. The fastening system includes a pin 110, a latch 120, at least one O-ring and an O-ring holder. The extraction plate 340 has an extraction aperture and at least one hole to accommodate a pin from the fastening system. Likewise, the blocker 350 may have at least one opening to accommodate the pin from the fastening system. In some embodiments, the O-ring holder may be the O-ring holder 130 of FIGS. 3-5, and one O-ring may be used. In other embodiments, the O-ring holder may be the O-ring holder 230 of FIGS. 6-9, which employs a plurality of O-rings 240.

The system and method described herein have many advantages. First, no metal parts are used. This reduces the amount of contaminants that are introduced into an ion source or plasma chamber, and also reduces the contaminants that are disposed on the workpieces. Additionally, in the first embodiment, the novel use of spokes allows the spring force of the fastening system to be tailored for a specific application. In other words, by selection of the number of spokes and the size and shape of those spokes, the spring force of the fastening system can be customized. Similarly, the number of 0-rings, and the dimensions of the vertical slots allows the spring force to be tailored in the second embodiment.

Additionally, the fastening systems described herein have application in any environment where the use of metal springs is discouraged or not possible.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A fastening system for fastening a first component to a second component, comprising:

a pin, having a head and a body;

a latch having a flange and a center opening dimensioned so that the body of the pin passes therethrough;

an O-ring holder having a circular recess with a bottom, an inner sidewall and an outer sidewall, wherein the O-ring holder is separate from and disposed on the second component; and a O-ring, where the O-ring is disposed in the circular recess and contacts an underside of the latch and the O-ring holder and wherein the flange extends downward and covers the O-ring and at least a portion of the outer sidewall of the O-ring holder.

2. The fastening system of claim 1, wherein the pin comprises a groove disposed along the body, where the center opening is dimensioned so that the latch is locked in the groove when rotated by a quarter turn.

3. The fastening system of claim 2, wherein the O-ring is compressed when the latch is locked in the groove.

4. The fastening system of claim 1, wherein the O-ring holder comprises a plurality of spokes, extending upward from the bottom of the circular recess, the plurality of spokes contacting a bottom surface of the O-ring.

5. The fastening system of claim 4, wherein each of the plurality of spokes attach to the inner sidewall and the outer sidewall.

6. The fastening system of claim 4, wherein each of the plurality of spokes comprises a free end, distal from the bottom, and wherein the free end of each of the plurality of spokes is tapered.

7. The fastening system of claim 4, wherein each of the plurality of spokes comprises a free end, distal from the bottom, and wherein the free end of each of the plurality of spokes is flat.

8. The fastening system of claim 4, wherein each of the plurality of spokes is spaced apart from an adjacent spoke by an angle of 360°/N, where N is a number of spokes.

9. The fastening system of claim 8, wherein N is between 3 and 8.

10. A fastening system for fastening a first component to a second component, comprising:

a pin, having a head and a body;

a latch having a center opening dimensioned so that the body of the pin passes therethrough;

an O-ring holder having a plurality of vertical slots; and a plurality of O-rings, where each of the plurality of O-rings is disposed in a respective vertical slot, and contacts an underside of the latch.

11. The fastening system of claim 10, wherein the pin comprises a groove disposed along the body, where the center opening is dimensioned so that the latch is locked in the groove when rotated by a quarter turn.

12. The fastening system of claim 11, wherein each of the plurality of O-rings is compressed when the latch is locked in the groove.

13. The fastening system of claim 10, wherein each of the plurality of vertical slots is spaced apart from an adjacent vertical slot by an angle of 360°/N, where N is a number of vertical slots.

14. The fastening system of claim 13, wherein N is between 3 and 8.

15. An extraction plate assembly for use with an ion source, comprising:

an extraction plate having an extraction aperture;

and a hole proximate the extraction aperture;

a blocker, having an opening; and a fastening system, comprising:

a pin, having a head and a body, passing through the hole and the opening;

a latch having a flange and a center opening dimensioned so that the body of the pin passes therethrough;

an O-ring holder; and an O-ring, wherein the O-ring is disposed in the O-ring holder and contacts an underside of the latch and wherein the flange extends downward and covers the O-ring and at least a portion of the O-ring holder.

16. The extraction plate assembly of claim 15, wherein the O-ring holder is disposed against the blocker.

17. The extraction plate assembly of claim 15, wherein the O-ring holder comprises a circular recess with a bottom, an inner sidewall and an outer sidewall; and the O-ring is disposed in the circular recess.

18. The extraction plate assembly of claim 17, wherein the O-ring holder comprises a plurality of spokes, extending upward from the bottom of the circular recess, the plurality of spokes contacting a bottom surface of the O-ring.

19. The extraction plate assembly of claim 15, wherein the O-ring holder comprises a plurality of vertical slots; and a plurality of O-rings, where each of the plurality of O-rings is disposed in a respective vertical slot.

* * * * *